US008324787B2

(12) United States Patent
Cerofolini

(10) Patent No.: US 8,324,787 B2
(45) Date of Patent: Dec. 4, 2012

(54) ARRAY OF ELECTROACOUSTIC TRANSDUCERS AND ELECTRONIC PROBE FOR DIAGNOSTIC IMAGES WITH HIGH FOCUSING DEPTH

(75) Inventor: Marino Cerofolini, Subbiano (IT)

(73) Assignee: Esaote, S.p.A., Milan (IT)

( * ) Notice: Subject to any disclaimer, the term of this patent is extended or adjusted under 35 U.S.C. 154(b) by 460 days.

(21) Appl. No.: 12/758,365

(22) Filed: Apr. 12, 2010

(65) Prior Publication Data

US 2010/0277038 A1 Nov. 4, 2010

(30) Foreign Application Priority Data

Apr. 30, 2009 (EP) .................................... 09425170

(51) Int. Cl.
*H01L 41/08* (2006.01)
*H04R 17/00* (2006.01)

(52) U.S. Cl. ........ 310/334; 600/437; 600/459; 367/155; 367/157

(58) Field of Classification Search .................. 310/334; 600/437, 459; 367/155, 157
See application file for complete search history.

(56) References Cited

U.S. PATENT DOCUMENTS 5,724,976 A 3/1998 Mine et al.
6,325,757 B1 12/2001 Erikson et al.
6,821,253 B2 * 11/2004 Wakabayashi et al. ....... 600/459
7,527,592 B2 * 5/2009 Haugen et al. ................ 600/447
2003/0055337 A1 3/2003 Lin
2010/0286527 A1 * 11/2010 Cannon et al. ................ 600/459

FOREIGN PATENT DOCUMENTS

EP 1 681 019 A 7/2006
GB 2016695 A 9/1979

OTHER PUBLICATIONS

European Search Report, Application No. 09425170.9-1240, Jul. 12, 2009.

* cited by examiner

*Primary Examiner* — Jaydi San Martin
(74) *Attorney, Agent, or Firm* — Woodard Emhardt Moriarty McNett & Henry LLP

(57) ABSTRACT

An electroacoustic transducer assembly and probe for emitting and receiving acoustic radiation beams. The transducer assembly comprising a plurality of transducer elements, each one composed of an electroacoustic element, arranged side by side and spaced apart along a row having a first end. Starting from transducer element proximate to the first end, adjacent transducer elements are constructed and arranged create an electroacoustic pair. A first element of the electroacoustic pair is constructed and arranged to only transmit acoustic pulses and a second element of the electroacoustic pair is constructed and arranged to only receive acoustic pulses. Each electroacoustic pair share a common connection line which branches off into a transmit branch connected to the first element and a receive branch connected to the second element.

19 Claims, 7 Drawing Sheets

ARRAY OF ELECTROACOUSTIC TRANSDUCERS AND ELECTRONIC PROBE FOR DIAGNOSTIC IMAGES WITH HIGH FOCUSING DEPTH

CROSS-REFERENCE TO RELATED APPLICATION

The present application claims the benefit of European Patent Application No. EP 09425170.9, filed on Apr. 30, 2009, which is hereby incorporated by reference in its entirety.

BACKGROUND

The present invention generally relates to the field of diagnostic imaging and, more specifically, to an array of electroacoustic transducers and an electronic probe for diagnostic imaging with a high focusing depth.

Transducer arrays are widely used for making ultrasound probes and they are the device for generating acoustic radiation beams or the device for receiving acoustic signals and for converting them into electric signals. Generally the same transducer array is used alternately both for generating acoustic radiation beams to be transmitted and for receiving acoustic pulses to be converted into electric signals. However the arrangement with an ultrasound probe provided with two transducer arrays operating independently one of which for transmitting acoustic radiation beams and the other one for receiving acoustic pulses cannot be ruled out.

As regards conventional ultrasound probes, each transducer element is composed of an electroacoustic element, for example a piezoelectric one, an electrode for the input/output of an electric signal exciting the electroacoustic element corresponding to the emission of an acoustic signal and an electric reception signal corresponding to an acoustic signal impinging on the corresponding electroacoustic element respectively being associated thereto, each electrode being in turn connected to a dedicated line for transmitting the electric excitation signal or the electric reception signal respectively and moreover each electroacoustic element being connected to a ground electrode and said electroacoustic elements being backed by an array made of acoustically and electrically insulating material wherein they are at least partially embedded the transducer array being provided with a predetermined number of transducers.

As regards such conventional probes, transducer elements composing the array of transducer elements are used alternately both for generating and emitting acoustic pulses, and for receiving acoustic pulses and for converting them into reception electric signals. Therefore transducer arrays are intended for generating the acoustic radiation beam that is transmitted to a body under examination and also for receiving acoustic pulses from the body under examination which derive from the acoustic radiation beam previously transmitted to such body under examination being reflected.

As regards conventional ultrasound probes, for example, the transmitting/receiving head comprises a front side from which acoustic radiation ultrasound beams are emitted in a direction of propagation towards a body under examination and on which front side pulses reflected from the body under examination impinge. Said head has a back side opposite to the front side and it is oriented towards the inside of the casing of the ultrasound probe and towards means for supporting said head inside the casing.

Acoustic radiation beams are composed of acoustic pulses emitted by the individual transducer elements that are combined together such to generate an acoustic radiation beam having a predetermined direction of propagation and a predetermined focusing along said direction of propagation.

Said transmitting/receiving head generally comprises, with an order starting from the back side towards the front side and corresponding to the direction of propagation of the acoustic waves, a first layer composed of an array of contact electrodes, having each one a separate electric line for the connection to an electric contact pin being a part of a multi-pin electric connector and provided at one peripheral edge of the layer of contact electrodes. The layer composed of the array of contact electrodes is overlapped by a further layer composed of an array of electroacoustic elements, particularly piezoelectric ones. These can be composed of ceramic elements and they constitute the individual transducers converting electric excitation signals into acoustic pulses emitted from one surface thereof and/or converting acoustic pulses impinging thereon into electric signals. Each one of the electroacoustic elements of the array is coincident with a contact electrode and is electrically connected thereto for example by means of a simple surface contact of each individual contact electrode of a corresponding electroacoustic element. The array of contact electrodes and of the overlapping electroacoustic elements is backed by an acoustically and electrically insulating material that can be a simple backing layer and/or it can embed at least partially the electrodes and the electroacoustic elements filling at least for a portion of the thickness of the overlapping contact electrodes and electroacoustic elements the gaps therebetween. A third layer is composed of a ground electrode. It can be in the form of a continuous sheet overlapping the side of the array of piezoelectric elements opposite to the one overlapped by the contact electrodes. As an alternative said third layer can be made like contact electrodes by an array of individual elements which are electrically separated one from the other and each one overlapping and being electrically connected only to one of the electroacoustic elements.

Generally on the third grounding layer there are provided one or more acoustic matching layers acting for matching the acoustic impedance of the transducers to the acoustic impedance of the operation environment, for example of the body under examination in this case where the transmitting/receiving head is used within an ultrasound probe.

These conventional probes provide a transmission and reception switch which, after each excitation of the transducer elements by the electric excitation signals, connects the connection lines of the individual transducer elements to a section receiving and processing the reception signals of the individual transducer elements generated from the acoustic pulses impinging on the sensitive surfaces thereof. The receiving and processing section extract information from reception signals, for example image data.

While as regards electric excitation signals, these are generated by a unit allowing also the power of such signals to be adjusted, as regards the reception signals, their power or intensity is limited to the characteristics of the transducer elements and since the transducer array of the probe is connected to the receiving and processing unit by a relatively long cable having a certain capacitance, it is necessary to provide each transducer element with a preamplifier for the reception signal. Due to that, the reception signal is not affected by the charge constituted by the capacitance of the connection cable and therefore the sensitivity and/or the bandwidth is improved.

By using the same transducer elements both for the transmission and reception and so by using the same connection lines for transmitting the excitation signal and for collecting the reception signals, each preamplifier is provided with a decoupling circuit avoiding short-circuit conditions between the output and the input when the transducer element is under the excitation phase.

As it is clear from the above, and particularly as far as linear or convex probes are concerned, where transducer elements are arranged side by side and are spaced apart at least along a row, the length of said row corresponds to the length of the transducer array and in the art it is the so-called aperture of the transducer array. Given a predetermined aperture, each transducer element is provided with a predetermined size in the length-wise direction of said row and such size, as far as linear or convex probes are concerned where only one row of transducer elements is provided, corresponds to the width of the transducer element and it is the so-called pitch of the transducer element.

Dimensional characteristics related to both the aperture of the array of transducer elements and to the pitch of the individual transducer elements affect the characteristics about the possibility of generating acoustic radiation beams having a good focusing effect even at deep penetration depths of the beam, i.e. at relatively deep distances from the emitting surface of the transducer array and so the possibility of increasing or keeping the resolution high even at such relatively deep depths; the possibility of steering said beam, i.e. of forming the acoustic radiation beam in a direction of propagation different than the one perpendicular to the emitting surface of the array of transducer elements, the sensitivity of the transducer array as regards reflected acoustic signals that are detected and converted into reception electric signals by said transducer array.

The equation defining the position of the natural focus within a transducer or a transducer array having a length D (defined as the aperture of the transducer) is the following:

$$F=D^2/4\lambda \qquad (1)$$

where λ is the wavelength.

Therefore the greater the length of a transducer element row is i.e. a linear or convex probe, that is the aperture of said transducer array, and the deeper the natural focus is and therefore the higher the ultrasound diagnostic image resolution is which is obtained from signals generated from said transducer array since the beam can be deeply focused reducing the size thereof. The need of making transducer arrays with apertures as wide as possible arise therefrom obviously whether the radiation lobe of the element allow them to be used. Given the number of transducers N in a transducer array (for example 192) and the scanning width L (for example 4-5 cm) the pitch (L/N) is automatically achieved that is the size of each transducer element in the direction parallel to the length-wise direction of the transducer element row forming the transducer array with the predetermined aperture D.

Each transducer element in turn has a radiation pattern which tends to diverge, with respect to the axis perpendicular to the surface emitting/receiving the acoustic pulses (direction of propagation or incidence of the acoustic pulses), by an angle θ such that:

$$\sin\theta=0.6\lambda/a \qquad (2)$$

where a denotes the radius of the transducer element assuming it has a circular section, or the size of the transducer element in the direction parallel to the length of the row of transducer elements.

With reference to the formula (2) it can be deduced that the larger the pitch of the transducer element is, the less the radiation diverges and, therefore, the more the radiation beam emitted from each individual element tends to be a tube with a diameter equal to the diameter of the transducer element. Vice versa, if the transducer element tends to approximate a point source, or a narrow source, the emitted beam tends to become wider till taking a radiation pattern that is theoretically spherical or cylindrical respectively.

Moreover the more the pitch of the individual transducer element is reduced, i.e. the narrower the transducer element is, the greater the possible steering effect can be.

The above theory is described in more details in the following publication "Physics and Instrumentation of Diagnostic Medical Ultrasound" by Peter Fish, John Wiley & Sons, chapter 4, pages 27-49.

From the above it is clear that the greatest limits in increasing the acquisition resolution, particularly in the case of linear and convex probes, are due to the radiation lobe of the individual element which is too narrow (about 15 to 20 degrees on average) since currently elements are wide i.e. they have a relatively large pitch, for scanning widths to be large enough.

With reference to conventional transducer arrays, i.e. having a limited number of transducer elements and so of channels connecting them to the units generating the excitation signals and to the units processing the reception signals the fact of decreasing the pitch of the transducer elements leads to a reduction of the overall surface receiving the acoustic pulses, i.e. of the surface sensitive to said acoustic pulses and, even in the case of arrays having 192 transducer elements, the scanning width L would be small and also the far-field focusing effect and sensitivity would be poor since the maximum aperture D would be limited by L.

SUMMARY

The present disclosure provides an improved electroacoustic transducer array and electronic probe. The claims, and only the claims, define the invention.

The present disclosure aims at providing a transducer array for emitting/receiving acoustic radiation beams that, with a limited number of transducer elements, particularly a small number of transducers such as the one typically used for two-dimensional imaging probes within conventional ultrasound apparatuses, allows ecographies to be carried out with the acoustic radiation beam highly focused as well as allowing said acoustic radiation beam to be highly steered, keeping at the same time a wide scanning depth.

Particularly the aim of the present disclosure is to provide an array of transducer elements intended for high-resolution imaging particularly for linear and convex probes, improving the acquisition, increasing the visual aperture (D) (and therefore the focusing ability), achieving at the same time the possibility of a high steering effect and with no losses in sensitivity.

The present disclosure achieves the above aims by providing an array of transducer elements of the type described hereinbefore and wherein, with the aperture of the array of transducer elements remaining the same, i.e. the length of one row of adjacent transducer elements remaining the same, there is provided a double, triple amount or an amount corresponding to a rational fraction of the number of transducers and having half the pitch, a third of the pitch or a pitch corresponding to said rational fraction respectively, the directly adjacent transducer elements being intended for emitting acoustic pulses and for receiving acoustic pulses respectively such to make two sub-arrays of transducer elements whose transducer elements are alternated one with respect to the other and are used only for transmitting and only for receiving acoustic pulses respectively, while directly adjacent transducer elements one of which intended for transmitting and the other one intended for receiving acoustic pulses respectively share the same connection line or channel which branches off by means of a buffer into a dedicated connection branch for each one of said two transmitting and receiving transducer elements respectively, there being provided a preamplifier for the reception signal within the branch for the connection to the receiving transducer element, i.e. the one intended only for receiving acoustic pulses.

Due to the above, a high-resolution imaging can be achieved particularly for linear and convex probes, increasing the visual aperture (D) (and therefore the focusing ability) on the basis of elements having a more spherical lobe without a loss in sensitivity.

Transducer arrays and therefore probes including said arrays of transducer elements are thus of the active type with transducer elements inserted into the decoupling between the individual elements and with narrow transducers, i.e. having a small pitch in order to achieve an acoustic radiation field as cylindrical or spherical as possible.

Due to the fact that each individual channel, i.e. each individual connection line manages two consecutive elements, one for the transmission and the other one for the reception, the number of channels may be kept constant as compared with a conventional probe, thus avoiding drawbacks related to the increase of the transmitting/receiving channels and related to the corresponding production of a too large multichannel cable.

Buffer means guarantee the excitation signal not to be spread within the branch dedicated to the receiving transducer element and therefore not to damage the preamplifier, while a decoupling circuit avoids the reception signal to be spread within the branch dedicated to the transmitting transducer element.

Buffer and decoupling means can be made according to any manner and are described in more detail below and are also the subject of the dependent claims.

The present disclosure aims at providing an ultrasound probe with a reduced number of transducer elements, with a deep focusing depth and a high steering effect to be used with conventional ultrasound apparatuses for acquiring high-resolution ultrasound three-dimensional images, particularly a probe of the so called linear or convex type and wherein the array of transducer elements comprises a row of adjacent transducer elements.

As far as the construction is concerned, with reference to the arrangement wherein the array of transducer elements provides each transducer element to be composed of a contact electrode overlapped by a piezoelectric element, while as regards pairs of adjacent transducer elements one of which intended only for emitting acoustic pulses and the other one intended only for receiving acoustic pulses each contact electrode of said two emitting receiving transducer elements is electrically connected each one to a dedicated branch, which branches are connected by means of a buffer circuit to a common channel or common connection line which is alternately connected to a unit generating the electric excitation signal and to a unit processing the electric reception signal.

Again with reference to an advantageous characteristic regarding the construction, each contact electrode of each pair of adjacent transducer elements composed of an emitting transducer element and a receiving transducer element, is connected by means of a conductive track on a board supporting the transducer array to a corresponding common contact pin of a multi-pin termination provided on said supporting board for the connection to a multi-channel cable connecting an ultrasound apparatus, buffer means and the decoupling circuit within the branch for the emitting transducer element and the preamplifier within the branch for the receiving transducer element being provided on said supporting board upstream of said multi-pin termination.

An alternative embodiment provides each contact electrode of each transducer element to be connected by means of a conductive track on a board supporting the transducer array to a corresponding contact pin of a multi-pin termination provided on said supporting board for the connection to a further printed circuit comprising a first multi-pin connector corresponding to the one on the transducer array supporting board for being mechanically and electrically connected thereto and a second multi-pin connector with a common connection pin for each pair of emitting and receiving transducer elements provided within the array of transducer elements, which second multi-pin connector cooperates with a corresponding multi-pin connector of a multi-channel cable, said printed circuit being provided with conductive tracks corresponding to the individual branches of said pairs of emitting and receiving transducer elements which are connected to a common pin of the connector connected to the multi-channel cable and within said branches and on said printed circuit there being provided buffer means of the two connection branches of each pair of emitting and receiving transducer elements, the decoupling circuit being provided within the branch for the emitting transducer element of said pair and the preamplifier being provided within the branch for the receiving transducer element of said pair.

The present disclosure provides an ultrasound probe comprising a casing wherein an head transmitting/receiving acoustic radiation beams or pulses is housed which transmitting/receiving head comprises a transducer array and which transducer array is made according to one or more of the combinations or subcombinations of the above mentioned characteristics.

A probe particularly suitable to be used for the present disclosure is the probe according to the patent application EP1681019 to the same applicant, wherein a particular embodiment of the construction of the array of transducer elements is suggested as regards the combination of two sub-arrays of transducer elements one of which intended only for emitting the acoustic pulses and the other one intended only for the reception.

Another characteristic that is advantageous for the present disclosure is the creation and architecture as well as the arrangement of the supporting boards, printed circuits and connectors for the different connection conductive tracks and for electronic components such as buffer means, decoupling circuits and preamplifiers.

Additionally, the following contrasting technical effects have been met: wide scanning width, possibilities of high steering effect guaranteeing a high-resolution for ultrasound images, without considering losses in the sensitivity.

Further improvements are the subject of the dependent claims.

The characteristics of the invention and the advantages derived therefrom will be more apparent from the following description of the non-limiting embodiments and as illustrated in the drawings.

DESCRIPTION OF THE SELECTED EMBODIMENTS

Figure 1:
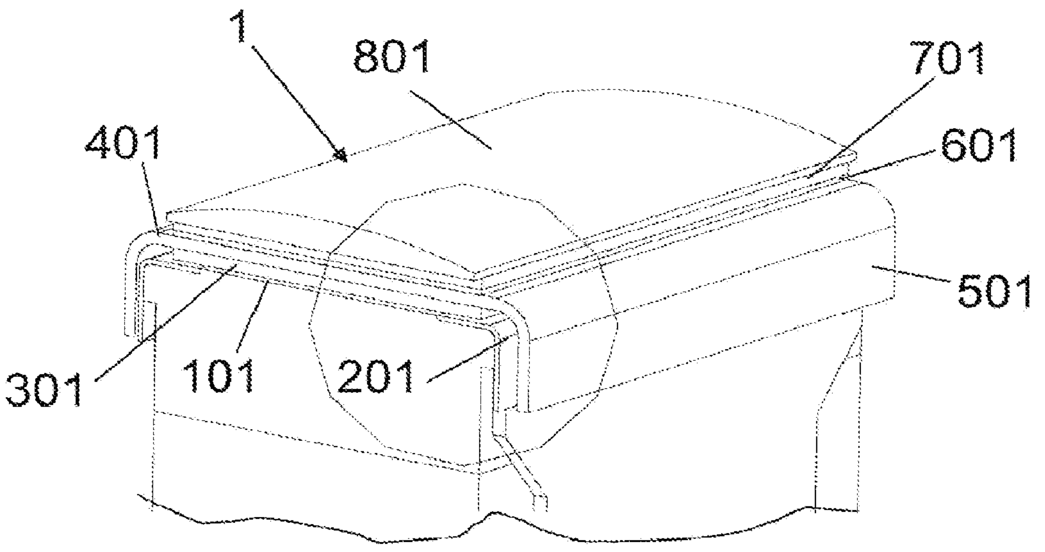
Fig. 1 (PRIOR ART)
FIG. 1 is a perspective view of the construction of a head transmitting/receiving acoustic radiation pulses or beams within a conventional ultrasound probe according to the prior art.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. One embodiment of the invention is shown in great detail, although it will be apparent to those skilled in the relevant art that some features that are not relevant to the present invention may not be shown for the sake of clarity.

The language used in the claims is to only have its plain and ordinary meaning, except as may be explicitly defined herein. Such plain and ordinary meaning is inclusive of all consistent dictionary definitions from the most recently published Webster's dictionaries and Random House dictionaries.

Figure 2:
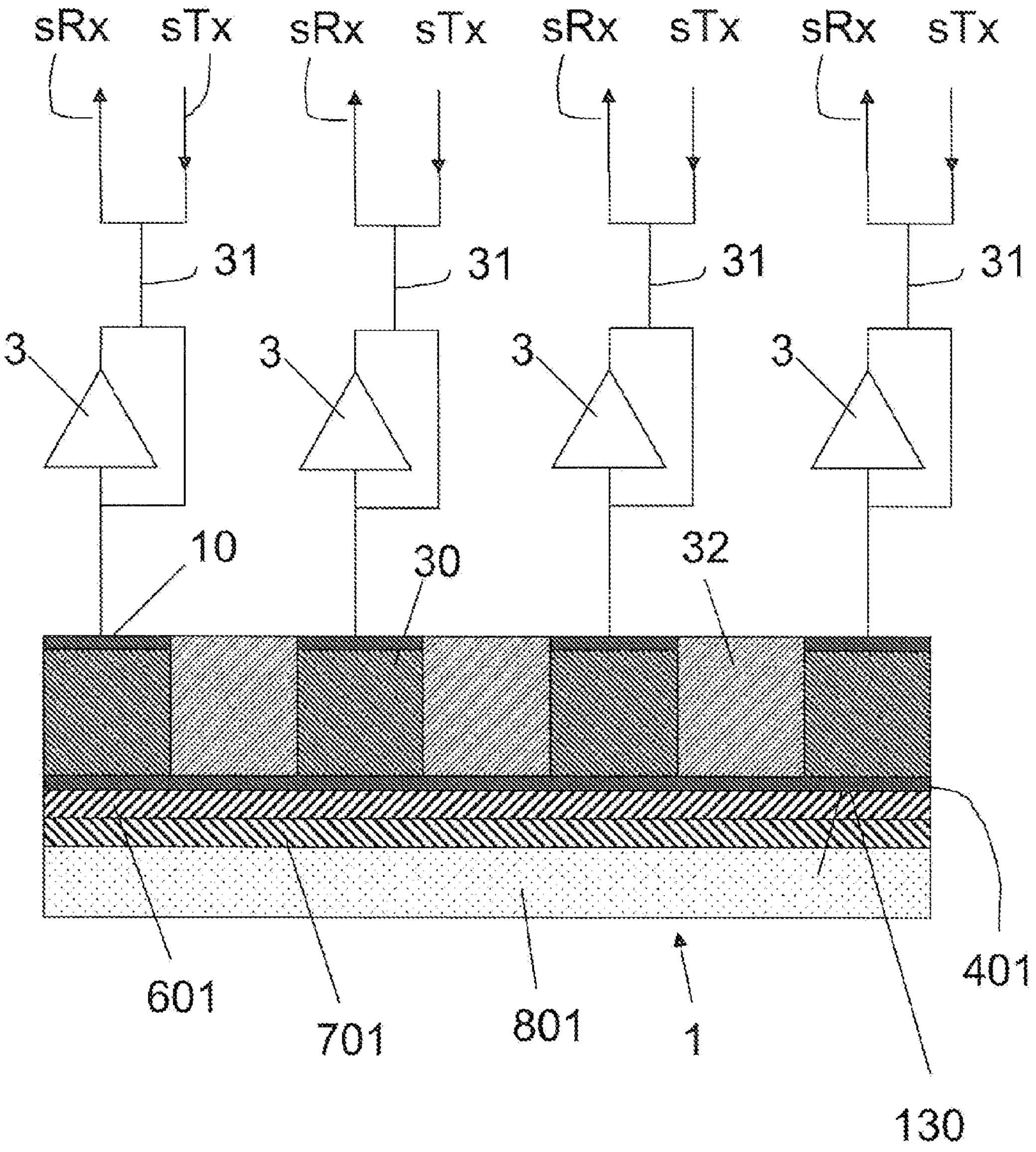
Fig. 2 (PRIOR ART)
FIG. 2 is a schematic view showing the principle according to which the transmitting/receiving head is made, that is the transducer array within the ultrasound probe of FIG. 1, with reference to some transducer elements.

With reference to FIGS. 1 and 2, a conventional ultrasound probe is shown therein. These types of probes have a head transmitting/receiving acoustic radiation beams or pulses comprising a transducer array composed of a small number of transducers. Generally the transducer array comprises 192 transducers. The latter may be arranged in a row such as for the so called linear probes or in two or more rows such as for volumetric probes. Transducer elements are arranged side by side with their surfaces emitting/receiving the acoustic radiation aligned in the same plane which is the front side of the transducer array and said emitting/receiving surfaces have a predetermined shape and a predetermined extension and the individual transducer elements are spaced apart at a predetermined extent. The length-wise dimension of the row of transducers of a linear probe is the so called aperture of the transducer array affecting both the scanning width and the focusing level of an acoustic radiation beam composed of the components of the acoustic signal of the individual transducer elements. The surface of the transducer elements determines the shape of the acoustic field of the emitted acoustic radiation and therefore it affects the presence of components of the acoustic signal that is the acoustic field for directions of propagation different from the one perpendicular to the emitting/receiving surface of each individual transducer element. A greater or smaller distribution of the emitted acoustic radiation in directions different from the one perpendicular to the emitting/receiving surface of each transducer element affects both the possibility of focusing the acoustic radiation beam of the transducer array and the possibility of emitting towards directions of propagation different from the one perpendicular to the front side of the transducer array. The surface of the emitting/receiving side of the individual transducer elements affects also the sensitivity of the transducer array as regards acoustic pulses impinging against the transducer array. As described in the introduction in more details the above characteristics are contrasting requirements when manufacturing transducer arrays particularly for ultrasound probes.

The conventional probe of FIGS. 1 and 2, comprises a head 1 emitting/receiving acoustic radiation beams or pulses which has a front side from which the ultrasound beams or pulses are emitted in a direction towards the body under examination and the acoustic radiation pulses and/or beams reflected from the body under examination to the probe fall on such front side. The emitting/receiving head 1 has a back side which is opposite to the front side and which is oriented towards the inside of the probe casing.

The emitting/receiving head comprises an array of transducer elements arranged side by side according to one or more perpendicular directions such to form only one row of transducer elements arranged side by side or various adjacent rows of transducer elements arranged side by side respectively.

The array of transducer elements is composed of three layers that in an order starting from the back side towards the front side of the emitting/receiving head 1 are composed of:

a first layer 101 composed of an array of contact electrodes. Each contact electrode of the array 101 of contact electrodes has a separate electric line for the connection to a corresponding contact pin of a contact termination that may be provided along at least one peripheral edge of the layer of contact electrodes and which contact termination is indicated with 201.

On the layer composed of the array 101 of contact electrodes, a layer 301 composed of an array of transducer elements, particularly piezoelectric elements such as for example ceramic elements is laid. Each one of the piezoelectric elements forms an emitting and/or receiving transducer element. Each one of the individual transducer elements is coincident and in electric contact with a corresponding contact electrode of the array 101 of contact electrodes. Particularly, each contact electrode is substantially congruent with the contact surface of the transducer element of the array 301 of transducer elements. A further layer overlapping the front side of the array 301 of transducer elements and so the front side thereof from which acoustic radiation beams or pulses are emitted and received, is composed of a single ground electrode 401 in electric contact with each one of the transducer elements of the array 301 of transducer elements. According to a variant embodiment the layer 401 may be in the form of an array of ground electrodes like the configuration of the array 101 of contact electrodes. Similarly to what described for the array 101 of contact electrodes, even with the continuous layer 401 constituting the common ground electrode or with said layer 401 composed of an array of electrically separated ground electrodes overlapped and congruent each one with one of the transducer elements, at a peripheral side of said layer 401 there is provided a contact termination 501 for the grounding connection.

Generally, the layer 401 in the form of a common ground electrode or in the form of an array of ground electrodes is overlapped by one, two or more acoustic impedance matching layers denoted by 601 and 701. These layers have the function of matching the acoustic impedance of the transducer array to the acoustic impedance of the body under examination acoustic radiation pulses or beams being transmitted thereto or reflected acoustic radiation pulses or beams being received therefrom.

As a last element on the acoustic impedance matching layer 701 an acoustic lens 801 is provided which forms the interface between the emitting/receiving head 1 and the surface of the body under examination.

The electric contact terminations 201 and 501 of the array 101 of contact electrodes and of the ground layer 401 respectively are electrically and mechanically connected to a printed circuit board 2 which is provided with the necessary conductive tracks. The latter are in turn connected to a multi-channel cable for the connection of the probe to an ultrasound apparatus such as for example an ultrasound diagnostic imaging apparatus.

As depicted in FIG. 2, the individual piezoelectric elements indicated by 30 which form the transducer elements of the array 301 are connected each one to the units of the ultrasound apparatus by means of a line 31. The connection lines 31 are called channels and are separated one with respect to the other for each transducer element. The connection lines 31 are connected to the contact electrode 10 of each corresponding transducer element and it acts both for feeding the excitation signal STX of the piezoelectric element to the transducer for exciting said piezoelectric element 30 to emit a corresponding acoustic pulse or an acoustic radiation beam, and for transmitting to processing units of the ultrasound apparatus reception electric signals SRX generated by the corresponding piezoelectric element 30 when an acoustic pulse or an acoustic radiation beam impinges thereon. Therefore the same connection line 31 alternately connects a corresponding transducer element to the units generating the excitation signals STX and to the units processing the received signals.

Since the cable connecting the probe to the ultrasound apparatus is a multi-channel cable having a separate conductor for each transducer element 30 of the array 301 of transducer elements, said cable is a capacitive charge attenuating the reception signals generated by the transducer elements. In order to increase the sensitivity and the passband also for current probes, for each connection line 31 a preamplifier 3 may be inserted. In order to allow preamplifiers to properly operate only on reception signals and not on excitation signals, preamplifiers are provided with decoupling circuits. The latter avoid the output of the preamplifier into the corresponding connection line 31 to be short-circuited with the input of the preamplifier during feeding of the excitation signals.

Figure 3:
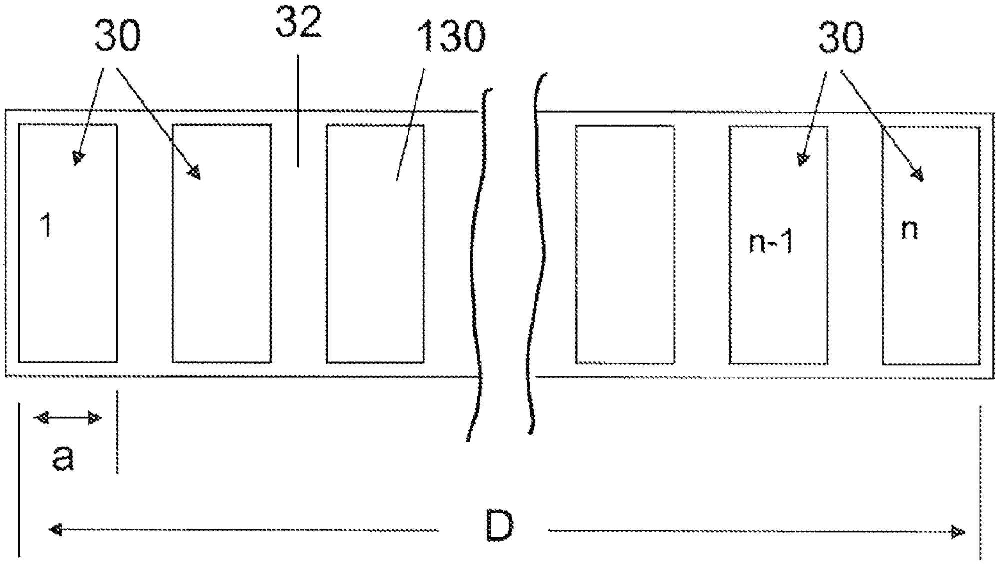
Fig. 3 (PRIOR ART)
FIGS. 3 and 4 are a schematic top plan view of an array of transducer elements according to the prior art and according to the present disclosure respectively and wherein D denotes the overall length of the row of adjacent transducer elements constituting the transducer array and a denotes the pitch of the individual transducer elements, that is their width in the direction of the aperture D of the transducer arrays.

Moreover as it results from FIG. 3, each piezoelectric element, i.e. each transducer element 30 is separated from the adjacent one by a predetermined distance, the array of transducer elements at gaps between transducer elements being filled with a material denoted by 32, said material being an acoustically and/or electrically insulating material such as air or materials having a low acoustic impedance.

FIG. 3 shows a schematic plan view of a transducer array provided with n transducer elements, where n is an integer. The array is typically provided within a linear or convex probe having only one row of transducer elements 30 arranged side by side, their width size being called pitch and being identified by the quantity "a" oriented parallel to the length of said row. The overall length of the row of transducer elements 30 constituting the array of transducer elements is denoted by the variable "D" and it is the so-called aperture of the transducer array or of the ultrasound probe wherein it is mounted.

In order to increase the resolution of ultrasound images generated by an array of transducer elements at a deep propagation depth of the emitted and received acoustic radiation beam, it is necessary to increase the aperture "D" of the array of transducer elements. In such case as it results from the expression (1), it is possible to achieve focal points more distant from the emitting/receiving surface of the transducer elements and so of the array of said elements.

However an increase of the aperture "D" should be followed by an increase of the pitch "a" as a=D/number of elements. An increase of the pitch "a", however, causes emitting/receiving lobe of the acoustic radiation of each transducer element to become smaller in amplitude in accordance to the expression (2), thus both the possibility of deep focusing and the possibility of electronically steering the emitted and/or received acoustic radiation beam fail.

A simple increase of the number of the transducer elements with the aperture "D" of the array of transducer elements remaining the same would cause the number of connection channels 31 to be increased. In addition to the cost related to each channel, as a separate conductor has to be provided for each channel within the multi-channel cable, constructional limitations in increasing the number of the channels related to the construction of the multi-channel cable would further arisen. Currently, linear probes comprise arrays of transducer elements with 192 transducer elements and therefore multi-channel cables comprise a corresponding number of separate conductors.

Figure 4:
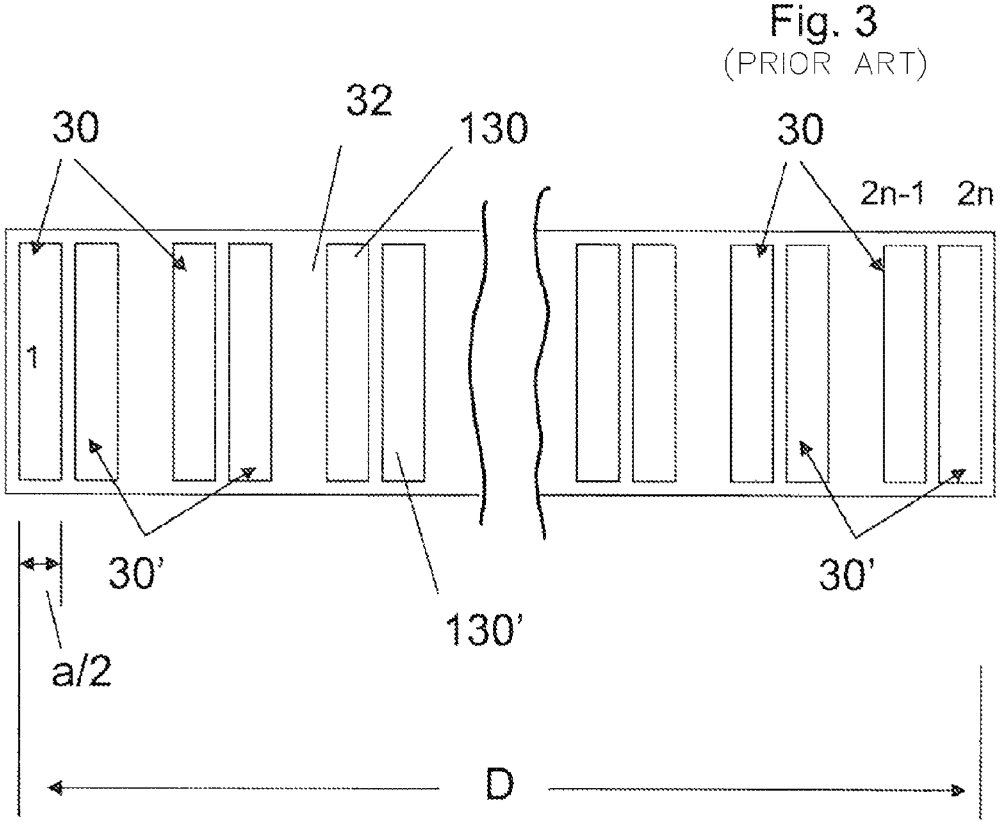

In order to make transducer arrays with a wide aperture for achieving suitable scanning widths obtaining optimum focusing effect up to deep depths within the body under examination with the possibility of highly steering the acoustic radiation beam and without losses in the sensitivity and at the same time allowing the number of channels i.e. the number of connections lines for the individual transducer elements to be kept reduced, the embodiment shown in FIG. 4 provides the number of the transducer elements to be increased with the aperture "D" of the array of transducer elements 30 remaining the same, therefore the latter having a pitch "a" reduced in a corresponding manner as a function of the increase in the number of transducer elements and the transducer elements to be divided into two groups the transducer elements of a first group being intended only for emitting acoustic pulses and the transducer elements of the second group being intended only for generating the reception signals caused by acoustic pulses impinging on or detected by said transducer elements.

This is shown in FIG. 4 in a very schematic way. Each one of the transducer elements of FIG. 3 is replaced by two transducer elements of FIG. 4 having each one half the pitch "a". It has to be noted that FIGS. 3 and 4 are only approximate figures and as such they do not represent a specific construction example, but they represent only the technical theory that forms the basis thereof, therefore dimensional inaccuracies have not to be considered as important or conflicting, but they are simply due to simplifications necessary for representing the technical principle.

The two groups of transducer elements 30, 30' of FIG. 4 are even order transducers and odd order transducers respectively. The transducer elements 30, 30' of the two groups are alternately arranged one with respect to the other each pair of two adjacent transducers 30, 30' each one belonging to one of the two groups share a common connection channel 31 as it will be described below in more detail.

Figure 5:
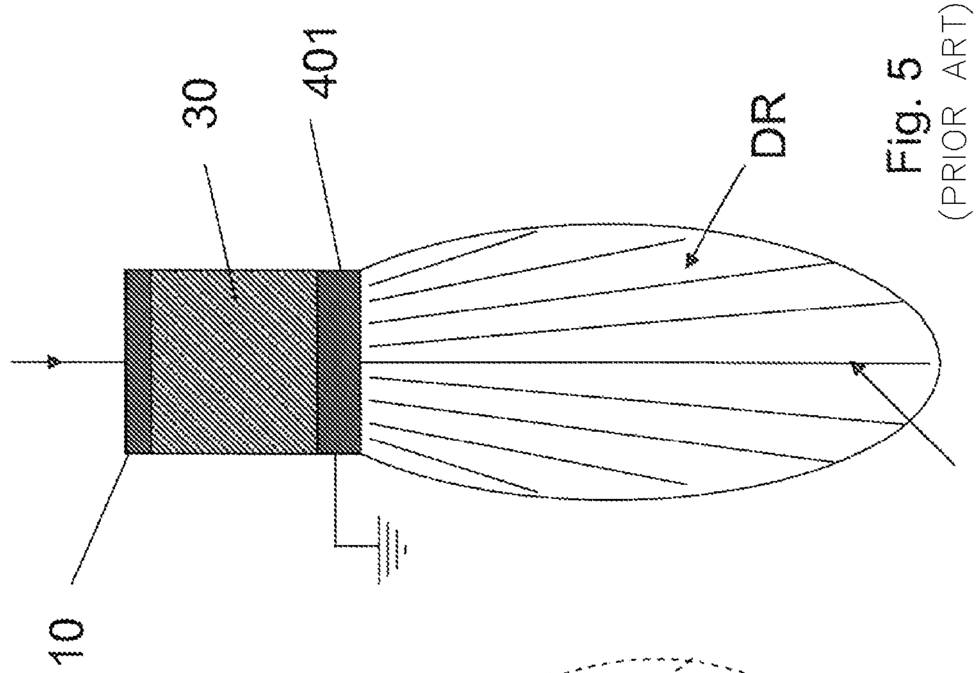
Fig. 5 (PRIOR ART)
FIGS. 5 and 6 very schematically and only approximately show the acoustic field generated by a transducer element having a size of the emitting/receiving surface according to the conventional element array of FIG. 3 and according to the element array of FIG. 4 according to one embodiment of the present disclosure.
Figure 6:
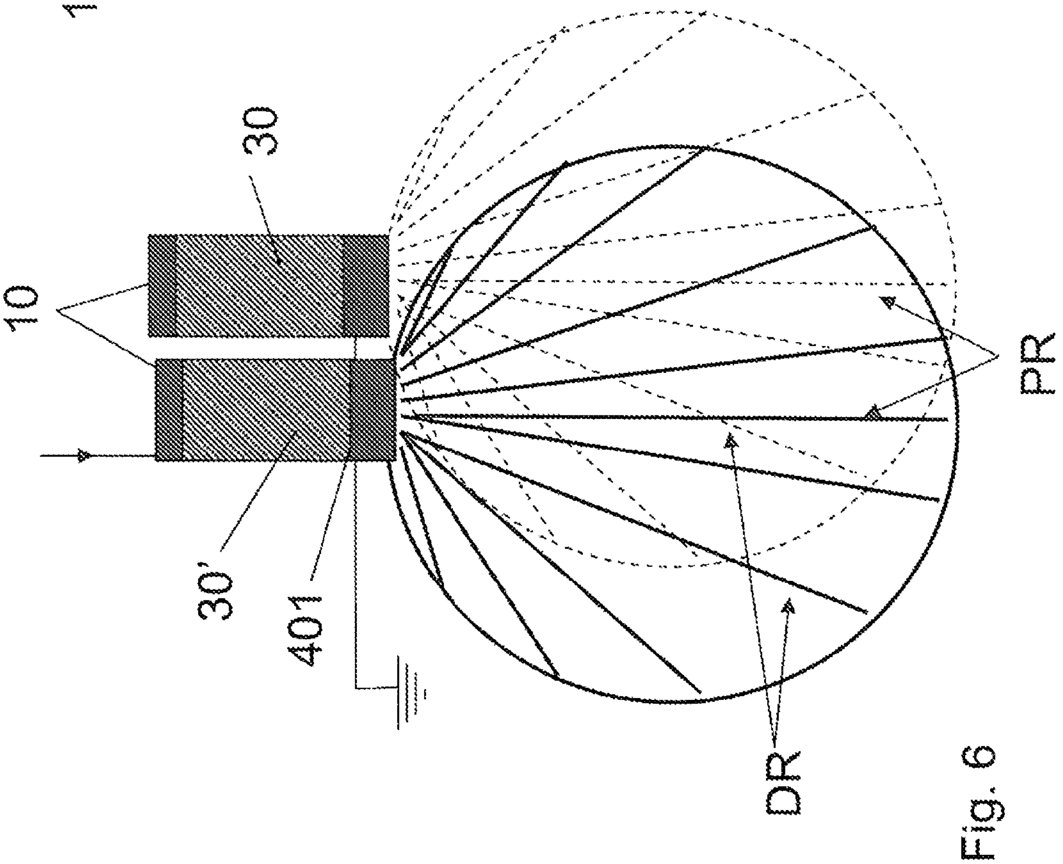

By the above arrangement and such as shown in FIGS. 5 and 6, the pitch "a" of the transducer elements is reduced and therefore the acoustic field or the emitting lobe are widened taking a cylindrical or spherical shape.

FIG. 5 shows the acoustic field generated by a transducer element 30 having a relatively large pitch "a", and i.e. the area of the emitting surface 130 of the transducer element is such that it cannot be considered as an approximation of a point source. As it can be seen, the acoustic field with reference to the main emitting lobe is narrow and the signal components have directions of propagation DR with relatively small deflection angles with respect to the direction of propagation PR according to the axis perpendicular to the emitting surface 130 of the transducer element 30.

According to what have been suggested by the present disclosure, FIG. 6 shows a pair of transducer elements 30, 30' replacing the transducer element 30 of FIG. 5 within an array of transducer elements having the same aperture D.

In this case, the emitting and receiving surface 103, 130' of the pair of transducer elements 30, 30' has a pitch smaller than the one of the transducer element of FIG. 5, particularly half the pitch and the acoustic field of the two transducer elements 30, 30' is cylindrical or similar to a cylindrical field and the directions of propagation DR of the signal components have a direction of propagation whose angles are relatively wide with respect to the direction of propagation PR perpendicular to the emitting/receiving surface of the transducer element.

Figure 7:
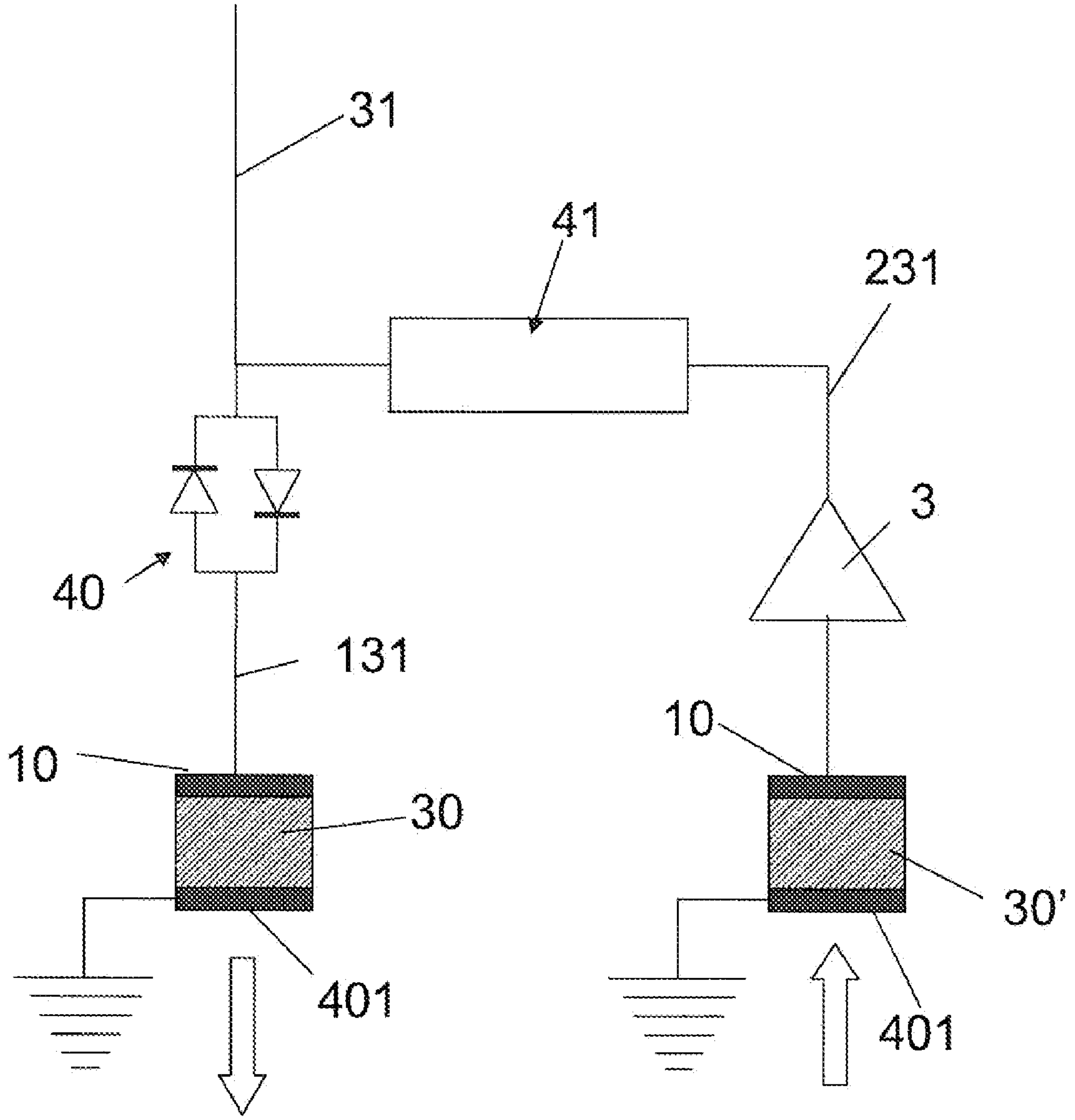
FIG. 7 is a schematic view of a first embodiment of the circuit for the connection to a common connection channel of a pair of adjacent transducer elements of an array of transducer elements according to the present disclosure and one of which is intended only for the reception and the other one is intended only for the emission of acoustic pulses.

As it is clear from FIG. 7, each pair of transducer elements 30, 30' belonging to one of the two groups or sub-arrays of emitting and receiving transducer elements respectively shares a common connection channel 31 allowing the emitting transducer element 30 to be connected to a unit generating the excitation signal and the receiving transducer element 30' to be connected to a processing unit alternately one with respect to the other. The alternate connection occurs by means of switches or multiplexing means, and the array of transducer elements is connected to an apparatus comprising said units by means of a multi-channel cable comprising a separate conductor for each channel and therefore it is in common with each pair of emitting and receiving transducers 30, 30'.

The reduction in the emission output due to the reduced pitch of the transducer elements of the group intended for emitting the acoustic pulses is compensated by a rise in the power of the excitation signal that can be carried out directly within the unit generating said signals. As regards receiving transducers 30', i.e. the ones belonging to the transducer element group intended only for converting the acoustic signals detected or impinging on said transducer elements into electric reception signals, the loss in the sensitivity of the reception signal has to be compensated directly upstream of the multi-channel connection cable since it has a certain capacitance that is a considerable charge for the element. In this case outputs of the receiving transducer elements 30' are connected to a preamplifier 3.

Each connection channel 31 is intended for connecting an emitting transducer element 30 and a receiving transducer element 30' to the unit generating excitation signals and to the unit processing reception signals respectively, there being provided connection branches 131, 231 of each connection channel 31. A first branch 131 connects the emitting transducer element 30 to the common connection channel 31 within said branch a decoupling circuit 40 being provided avoiding the reception signal to be spread on said emitting transducer element and so avoiding the power of the output signal from the preamplifier to be dissipated on said transmitting element. The second branch 231 connects the receiving transducer element 30' to said common connection channel through a preamplifier 3 and a buffer 41 being provided avoiding the relatively high voltage of the excitation signal to reach the preamplifier output avoiding it to be damaged.

Figure 8:
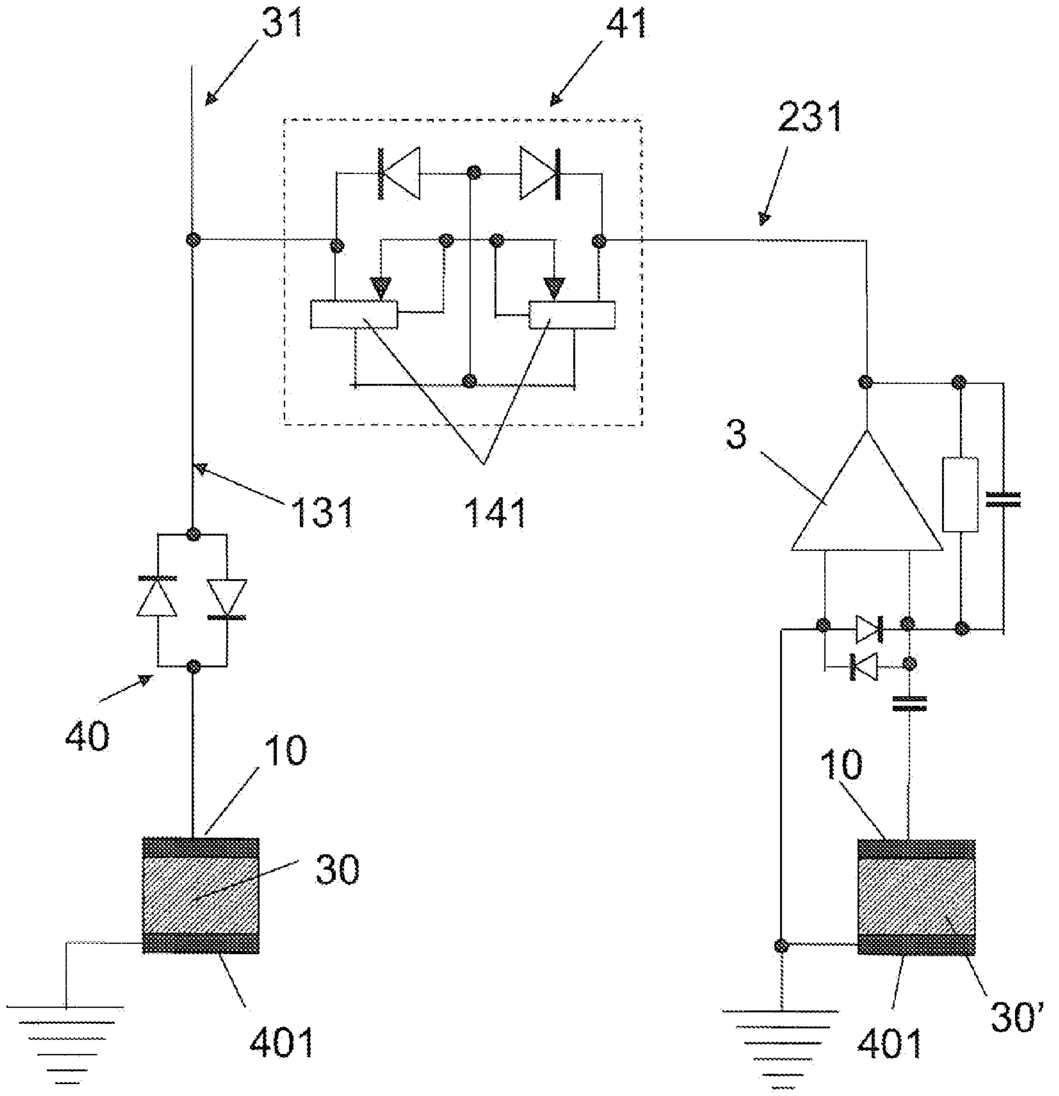
FIG. 8 depicts an embodiment of the circuit for the connection to the common communication channel of the two receiving and emitting transducer elements showing in details a manner for designing buffer means.

While FIG. 7 generally shows such circuits 3, 40, 41, FIG. 8 shows an additional embodiment. Particularly FIG. 8 shows the circuit diagram of a particularly advantageous buffer 41.

The buffer provides two Mosfets 141 connected in such a way that they do not to require bias current and therefore such to keep a very low consumption as compared to other circuits having the same function such as for example diode bridges or the like.

The two Mosfets 141 are of the normally-on type. The gate and the source are coupled together so they act with a characteristic curve of the voltage between the gate and the source $V_{gs}$ equal to zero. With no excitation pulse is transmitted to the excitation transducer element, both Mosfets 141 conduct and allow the reception signal from the preamplifier to pass through the buffer and within the connection channel 31. The decoupling circuit 40 stops the reception signal from passing towards the emitting transducer element 30.

On the contrary, when an excitation pulse is transmitted to the emitting transducer element 30, the buffer 41 does not allow the excitation pulse from passing towards the preamplifier 3 and also towards the receiving transducer element 30'. One of the two Mosfets 141 is switched in the opening condition of the circuit depending on the polarity of the excitation pulse. The cutoff current also for high voltage of the excitation pulse and therefore for high source voltage (typically about 100V) do not exceed 20 mA and the Mosfet absorbs the energy of the excitation pulse on the branch 231 towards the preamplifier 3 that therefore is not reached by said excitation pulse.

As it is known, branches 131 and 231 may be provided as conductive tracks of a printed circuit board and the electronic components for making the decoupling circuit 40, buffer means 41 and the preamplifier 3 may be mounted onto said printed circuit boards providing conductive tracks that are properly designed for connecting said electronic components.

Figure 9:
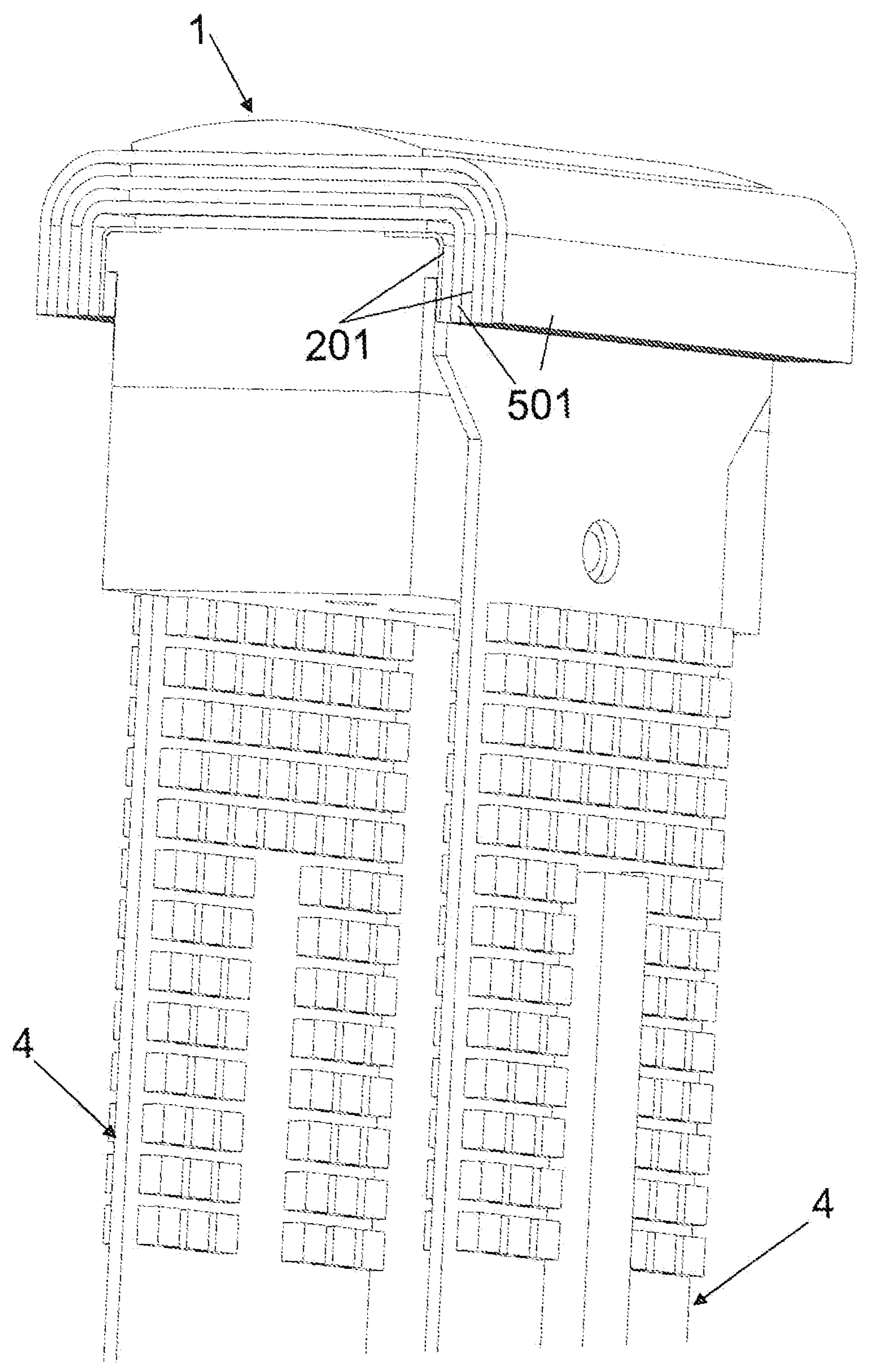
FIG. 9 is the construction of an ultrasound probe having a circuit for processing electric excitation and reception signals integrated within the probe casing and allowing electronic components of circuits according to FIGS. 8 and 9 to be easily mounted within the casing of an ultrasound probe.

FIG. 9 shows a particular constructional example of an ultrasound probe intended for mounting a transducer array according to the present disclosure and electronic circuits associated thereto.

An emitting/receiving head 1 of the type described hereinbefore and comprising an array of transducer elements according to the present disclosure is connected by means of terminations 201, 501 to printed circuit boards provided inside the casing of the ultrasound probe and denoted by 4 upon which both electronic circuits and delay inductances can be also provided. A more detailed description of the configuration is disclosed in EP 1681019 to the same applicant.

In the arrangement of FIG. 9 it is important the fact that it is possible to provide a considerable space inside the probe for mounting electric or electronic components.

Finally it is important to note that while the preferred embodiment provides the number of transducer elements to be twofold increased for a given predetermined aperture of the array of transducer elements, it is also possible to provide the number of transducers to be increased three or more times as the conventional number of transducers. In this case it would be preferable to provide increase factors for the number of transducers to be even numbers. That allows subgroups of emitting and receiving transducer elements comprising a number of transducer elements corresponding to a multiple of two to be connected by means of multiplexing and by means of buffer means and decoupling means.

It has to be noted also that while the embodiments of the present disclosure are particularly advantageous as regards linear or convex arrays of transducer elements, i.e. substantially one-dimensional ones, the inventive concept may be applied and extended to probes with two-dimensional arrays of transducer elements and i.e. where several adjacent rows of transducer elements are provided, inventive arrangements being applicable also to transducer elements regarding columns and not only rows of transducer arrays. In such case, each conventional transducer element may be divided into four adjacent elements arranged according to a 2×2 array, two of said elements being intended for emitting acoustic pulses and two of said transducer elements being intended for receiving acoustic pulses and the four transducer elements sharing the same connection channel.

With reference to the previous description it has to be noted that transducer elements can be of any type, such as for example ceramic piezoelectric ones, composite ones (that is with piezoelectric ceramic diced into microelements separated by resin for reducing the acoustic impedance), single-crystal ones (that is made by a growth of piezoelectric material), or C-Mut ones and therefore when the description refers to a transducer element as to its specific piezoelectric element form characteristics provided in combination with said piezoelectric element can be provided in combination with any specific constructional form of said transducer element.

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected. It is also contemplated that structures and features embodied in the present examples can be altered, rearranged, substituted, deleted, duplicated, combined, or added to each other. The articles "the", "a" and "an" are not necessarily limited to mean only one, but rather are inclusive and open ended so as to include, optionally, multiple such elements. All publications, patents, and patent applications cited in this specification are herein incorporated by reference as if each individual publication, patent, or patent application were specifically and individually indicated to be incorporated by reference and set forth in its entirety herein.

What is claimed is:

1. An electroacoustic transducer assembly for emitting and receiving acoustic radiation beams, the assembly comprising:

an array of electroacoustic transducers comprising, a plurality of transducer elements each one composed of an electroacoustic element, the transducers are arranged side by side and are spaced apart along a row, the transducer array having an aperture dimension corresponding the length of the row of transducers, each transducer of the plurality of transducers having an equal pitch corresponding the transducer width in the length-wise direction of the row;

a first layer into which the transducer elements are embedded, the layer is made of an electrically insulating material; and a connection line is constructed and arranged to alternately electrically connect each one of the transducers to a unit generating a signal exciting the individual transducer element to emit an acoustic radiation and to a unit processing an electric reception signal generated by the transducer element having received an acoustic signal, wherein for the aperture dimension, there is provided a rational multiple number of transducers each having a pitch corresponding to the inverse of the rational multiple, each pair of directly adjacent transducer elements are constructed and arranged to create an electroacoustic pair, one transducer element of the electroacoustic pair is constructed and arranged to only transmit acoustic pulses and the other transducer element of the electroacoustic pair is constructed and arranged to only receive acoustic pulses, each electroacoustic pair share the same connection line which branches off by means of a buffer into a transmit branch and a receive branch for each one of the transducer elements within the electroacoustic pair respectively, a preamplifier is located within the receive branch connected to the transducer element of the electroacoustic pair constructed and arranged to receive acoustic pulses.

2. The assembly of claim 1, wherein the rational multiple is two such that there is provided a double number of transducer elements (30, 30'), half of the transducer elements (30) are constructed and arranged to only emit acoustic pulses and the other half of the transducer elements (30') are constructed and arranged to only receive acoustic pulses, the transducer elements (30, 30') are arranged such that two adjacent transducer elements form a pair of transducer elements of which a first one is intended only for emitting acoustic pulses and the second one is intended only for receiving acoustic pulses and which two transducer elements share a common receiving channel, the first transducer element being connected thereto by means of a decoupling circuit and the second transducer element being connected thereto by means of a buffer circuit and the preamplifier.

3. The assembly of claim 2, wherein each transducer element is composed of a contact electrode overlapped by a piezoelectric element, each contact electrode for each transducer element within each pair of transducer elements is electrically connected to the same connection line.

4. The assembly of claim 3, wherein each contact electrode of each pair of transducer elements is connected by means of a conductive track on a board supporting the transducer array to a corresponding common contact pin of a multi-pin termination provided on the supporting board for the connection to a multi-channel cable connecting an ultrasound apparatus, buffer means and the decoupling circuit within the transmit branch for the emitting transducer element and the preamplifier within the receive branch for the receiving transducer element being provided on the supporting board upstream of the multi-pin termination.

5. The assembly of claim 3, wherein each contact electrode of each transducer element is connected by means of a conductive track on a board supporting the transducer array to a corresponding contact pin of a multi-pin termination provided on the supporting board for the connection to a further printed circuit comprising a first multi-pin connector corresponding to the one on the transducer array supporting boards for mechanical and electrical connection thereto and a second multi-pin connector with a common connection pin for each pair of transducer elements, the second multi-pin connector cooperates with a corresponding multi-pin connector of a multi-channel cable, said printed circuit being provided with a plurality of conductive tracks corresponding to the transmit and receive branches of each transducer element within the pair of transducer elements which are connected to a common pin of the connector connected to the multi-channel cable and within the branches, the printed circuit has the buffer means the transmit and receive branches of each pair of emitting and receiving transducer elements, the decoupling circuit being provided within the transmit branch for the emitting transducer element of said pair and the preamplifier being provided within the receive branch for the receiving transducer element of said pair.

6. The assembly of claim 1, the rational multiple is two such that there is provided a plurality of subgroups of transducer elements comprising an equal number of emitting transducer elements and of receiving transducer elements which comprise a number of transducer elements corresponding to a multiple of two and which are connected to a common connection channel by means of either a transmit branch or a receive branch and a decoupling circuit, a buffer circuit and the preamplifier.

7. The assembly of claim 1, wherein the array of transducer elements is two-dimensional and comprises several adjacent rows of transducer elements which are alternately arranged one with respect each other, each transducer element is divided into four adjacent elements arranged according to a 2.times.2 array, two of the four adjacent elements are constructed and arranged to emit acoustic pulses and the other two of the four adjacent elements are constructed and arranged to receive acoustic pulses, all four transducer elements are electrically connection to a common connection line.

8. The assembly of claim 1, further comprising a decoupling circuit provided within the receive branch for the connection of each receiving transducer element, the buffer comprises two Mosfets connected in such a way that they do not to require bias currents, the two Mosfets are constructed of the normally-on type therefore with no excitation pulse transmitted to the excitation transducer element, both Mosfets are constructed and arranged to conduct and allow the reception signal received from the preamplifier to pass through the buffer, while the decoupling circuit stops the reception signal from passing towards the emitting transducer element, when an excitation pulse is transmitted to the emitting transducer element, one of the two Mosfets is switched in the opening condition of the circuit depending on the polarity of the excitation pulse and the Mosfet absorbs the energy of the excitation pulse on the receiving branch.

9. An ultrasound probe comprising:

a casing enclosing a head constructed and arranged for transmitting/receiving acoustic radiation beams or pulses, the head comprising an array of electroacoustic transducers comprising, a plurality of transducer elements each one composed of an electroacoustic element, the transducers are arranged side by side and are spaced apart along a row, the transducer array having an aperture dimension corresponding the length of the row of transducers, each transducer of the plurality of transducers having a pitch corresponding the transducer width in the length-wise direction of the row;

a first layer into which the transducer elements are embedded, the layer is made of an electrically insulating material; and a connection line is constructed and arranged to alternately electrically connect each one of the transducers to a unit generating a signal exciting the individual transducer element to emit an acoustic radiation and to a unit processing an electric reception signal generated by the transducer element having received an acoustic signal, wherein for the aperture dimension, there is provided a rational multiple number of transducers each having a pitch corresponding to the inverse of the rational multiple, each pair of directly adjacent transducer elements are constructed and arranged to create an electroacoustic pair, one transducer element of the electroacoustic pair is constructed and arranged to only transmit acoustic pulses and the other transducer element of the electroacoustic pair is constructed and arranged to only receive acoustic pulses, each electroacoustic pair share the same connection line which branches off by means of a buffer into a transmit branch and a receive branch for each one of the transducer elements within the electro acoustic pair respectively, a preamplifier is located within the receive branch connected to the transducer element of the electroacoustic pair constructed and arranged to receive acoustic pulses.

10. The probe of claim 9, wherein the rational multiple is two such that there is provided a double number of transducer elements (30, 30'), half of the transducer elements (30) are constructed and arranged to only emit acoustic pulses and the other half of the transducer elements (30') are constructed and arranged to only receive acoustic pulses, the transducer elements (30, 30') are arranged such that two adjacent transducer elements form a pair of transducer elements of which a first one is intended only for emitting acoustic pulses and the second one is intended only for receiving acoustic pulses and which two transducer elements share a common receiving channel, the first transducer element being connected thereto by means of a decoupling circuit and the second transducer element being connected thereto by means of a buffer circuit and the preamplifier.

11. The probe of claim 10, wherein each transducer element is composed of a contact electrode overlapped by a piezoelectric element, each contact electrode for each transducer element within each pair of transducer elements is electrically connected to the same connection line.

12. The probe of claim 11, wherein each contact electrode of each pair of transducer elements is connected by means of a conductive track on a board supporting the transducer array to a corresponding common contact pin of a multi-pin termination provided on the supporting board for the connection to a multi-channel cable connecting an ultrasound apparatus, buffer means and the decoupling circuit within the transmit branch for the emitting transducer element and the preamplifier within the receive branch for the receiving transducer element being provided on the supporting board upstream of the multi-pin termination.

13. The probe of claim 11, wherein each contact electrode of each transducer element is connected by means of a conductive track on a board supporting the transducer array to a corresponding contact pin of a multi-pin termination provided on the supporting board for the connection to a further printed circuit comprising a first multi-pin connector corresponding to the one on the transducer array supporting boards for mechanical and electrical connection thereto and a second multi-pin connector with a common connection pin for each pair of transducer elements, the second multi-pin connector cooperates with a corresponding multi-pin connector of a multi-channel cable, said printed circuit being provided with a plurality of conductive tracks corresponding to the transmit and receive branches of each transducer element within the pair of transducer elements which are connected to a common pin of the connector connected to the multi-channel cable and within the branches, the printed circuit has the buffer means the transmit and receive branches of each pair of emitting and receiving transducer elements, the decoupling circuit being provided within the transmit branch for the emitting transducer element of said pair and the preamplifier being provided within the receive branch for the receiving transducer element of said pair.

14. The probe of claim 9, the rational multiple is two such that there is provided a plurality of subgroups of transducer elements comprising an equal number of emitting transducer elements and of receiving transducer elements which comprise a number of transducer elements corresponding to a multiple of two and which are connected to a common connection channel by means of either a transmit branch or a receive branch and a decoupling circuit, a buffer circuit and the preamplifier.

15. The probe of claim 9, wherein the array of transducer elements is two-dimensional and comprises several adjacent rows of transducer elements which are alternately arranged one with respect each other, each transducer element is divided into four adjacent elements arranged according to a 2.times.2 array, two of the four adjacent elements are constructed and arranged to emit acoustic pulses and the other two of the four adjacent elements are constructed and arranged to receive acoustic pulses, all four transducer elements are electrically connection to a common connection line.

16. The probe of claim 9, further comprising a decoupling circuit provided within the receive branch for the connection of each receiving transducer element, the buffer comprises two Mosfets connected in such a way that they do not to require bias currents, the two Mosfets are constructed of the normally-on type therefore with no excitation pulse transmitted to the excitation transducer element, both Mosfets are constructed and arranged to conduct and allow the reception signal received from the preamplifier to pass through the buffer, while the decoupling circuit stops the reception signal from passing towards the emitting transducer element, when an excitation pulse is transmitted to the emitting transducer element, one of the two Mosfets is switched in the opening condition of the circuit depending on the polarity of the excitation pulse and the Mosfet absorbs the energy of the excitation pulse on the receiving branch.

17. An electroacoustic transducer assembly for emitting and receiving acoustic radiation beams, the assembly comprising:

a plurality of transducer elements each one composed of an electroacoustic element, the transducers are arranged side by side and are spaced apart along a row having a first end, a first layer into which the transducer elements are embedded, the layer is made of an electrically insulating material; and a connection line is constructed and arranged to alternately electrically connect each one of the transducers to a unit generating a signal exciting the individual transducer element to emit an acoustic radiation and to a unit processing an electric reception signal generated by the transducer element having received an acoustic signal, wherein, starting from transducer element proximate to the first end, adjacent transducer elements are constructed and arranged to create an electroacoustic pair, a first element of the electroacoustic pair is constructed and arranged to only transmit acoustic pulses and a second element of the electroacoustic pair is constructed and arranged to only receive acoustic pulses, each electroacoustic pair share the same connection line which branches off into a transmit branch connected to the first element and a receive branch connected to the second element, a buffer is located between the transmit branch and the receive branch, a preamplifier is located within the receive branch.

18. The assembly of claim 17, further comprising a decoupling circuit provided within the receive branch for the connection of each receiving transducer element, the buffer comprises two Mosfets connected in such a way that they do not to require bias currents, the two Mosfets are constructed of the normally-on type therefore with no excitation pulse transmitted to the excitation transducer element, both Mosfets are constructed and arranged to conduct and allow the reception signal received from the preamplifier to pass through the buffer, while the decoupling circuit stops the reception signal from passing towards the emitting transducer element, when an excitation pulse is transmitted to the emitting transducer element, one of the two Mosfets is switched in the opening condition of the circuit depending on the polarity of the excitation pulse and the Mosfet absorbs the energy of the excitation pulse on the receiving branch.

19. A method of making a design modification to an existing electroacoustic array, the transducer array being composed of a plurality of transducer elements made of an electroacoustic element, the transducers are arranged side by side and are spaced apart along a row, the method comprising the steps of:

evaluating an aperture dimension of the transducer array, the aperture corresponding to the length of the row of transducers;

evaluating a first pitch dimension of each transducer of the plurality of transducer elements, the first pitch dimension corresponding the transducer width in the lengthwise direction of the row;

dividing each of said transducer elements into a group of smaller transducer elements, the number of transducer elements in the group being an even number, the cumulative pitch of the transducer elements of the group is substantially equal to the first pitch dimension, a first element of the group is constructed and arranged to only transmit acoustic pulses and a second element of the group is constructed and arranged to only receive acoustic pulses;

electrically coupling each transducer element of the group to a common connection line, the connection line is constructed and arranged to alternately electrically connect the first element to a unit constructed and arranged to generate a signal capable of exciting the first element to emit an acoustic radiation and connect the second element to a unit processing an electric reception signal generated by the second element having received an acoustic signal, the connection line branches off into a transmit branch connected to the first element and a receive branch connected to the second element;

providing a buffer electrically connected between the transmit branch and the receive branch; and, providing a preamplifier electrically connected on the receive branch.

* * * * *